(12) United States Patent
Aiton et al.

(10) Patent No.: US 7,262,123 B2
(45) Date of Patent: Aug. 28, 2007

(54) METHODS OF FORMING WIRE BONDS FOR SEMICONDUCTOR CONSTRUCTIONS

(75) Inventors: John Aiton, Boise, ID (US); Joseph M. Richards, Boise, ID (US); J. Brett Rolfson, Boise, ID (US); John M. Drynan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 364 days.

(21) Appl. No.: 10/903,348

(22) Filed: Jul. 29, 2004

(65) Prior Publication Data

US 2006/0024942 A1 Feb. 2, 2006

(51) Int. Cl.
*H01L 21/44* (2006.01)

(52) U.S. Cl. .............................. 438/617; 438/E21.509; 438/E21.517

(58) Field of Classification Search ................ 438/612, 438/613, 614, 615, 616, 617
See application file for complete search history.

(56) References Cited

U.S. PATENT DOCUMENTS

| | | | |
|---|---|---|---|
| 5,936,707 A | 8/1999 | Nguyen et al. | |
| 5,986,335 A | 11/1999 | Amagai | |
| 6,143,638 A * | 11/2000 | Bohr | 438/612 |
| 6,444,489 B1 * | 9/2002 | Lin | 438/107 |
| 2002/0145206 A1 * | 10/2002 | Park et al. | 257/782 |
| 2002/0146898 A1 * | 10/2002 | Aoki | 438/617 |
| 2003/0168734 A1 * | 9/2003 | Fang | 257/734 |

* cited by examiner

*Primary Examiner*—W. David Coleman
*Assistant Examiner*—Su C. Kim
(74) *Attorney, Agent, or Firm*—Wells St. John P.S.

(57) ABSTRACT

The invention includes a semiconductor construction having a wire bonding region associated with a metal-containing layer, and having radiation-imageable material over the metal-containing layer. The radiation-imageable material can be configured as a multi-level pattern having a first topographical region with a first elevational height and a second topographical region with a second elevational height above the first elevational height. The second topographical region can be laterally displaced from the bonding region by at least a lateral width of the first topographical region, with said lateral width being at least about 10 microns. Additionally, or alternatively, the elevational height of the second topographical region can be at least about 2 microns above the elevational height of the first topographical region. The invention also includes a method of forming wire bonds for semiconductor constructions in which a multi-level pattern is photolithographically formed in a radiation-imageable material (such as, for example, polyimide).

28 Claims, 10 Drawing Sheets

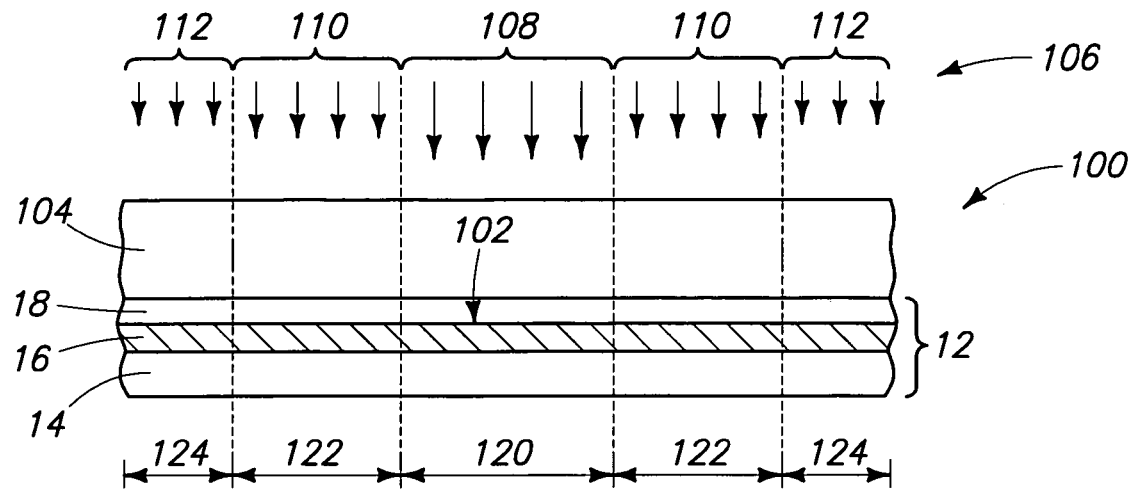
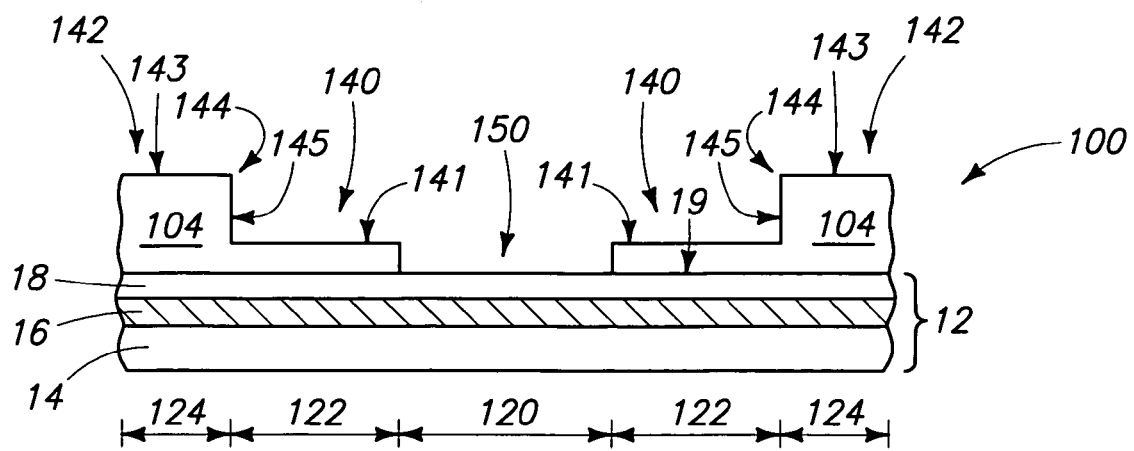
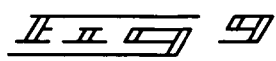

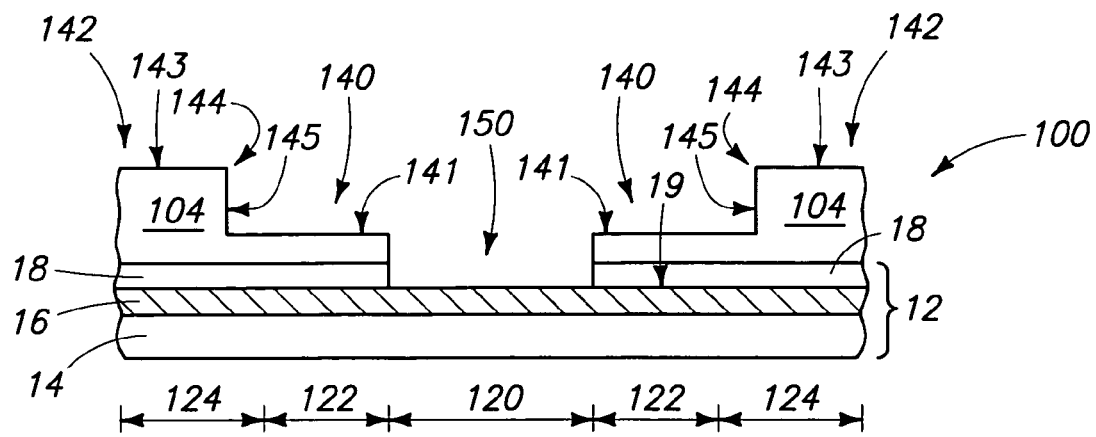
_FIG. 10_
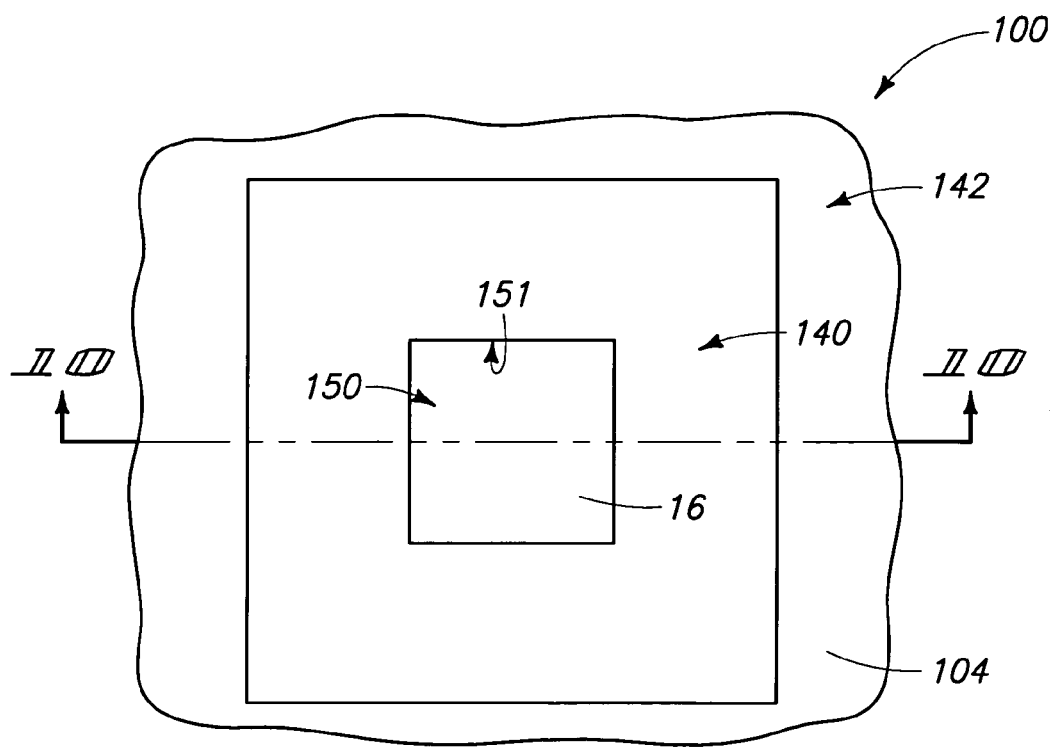
_FIG. 11_

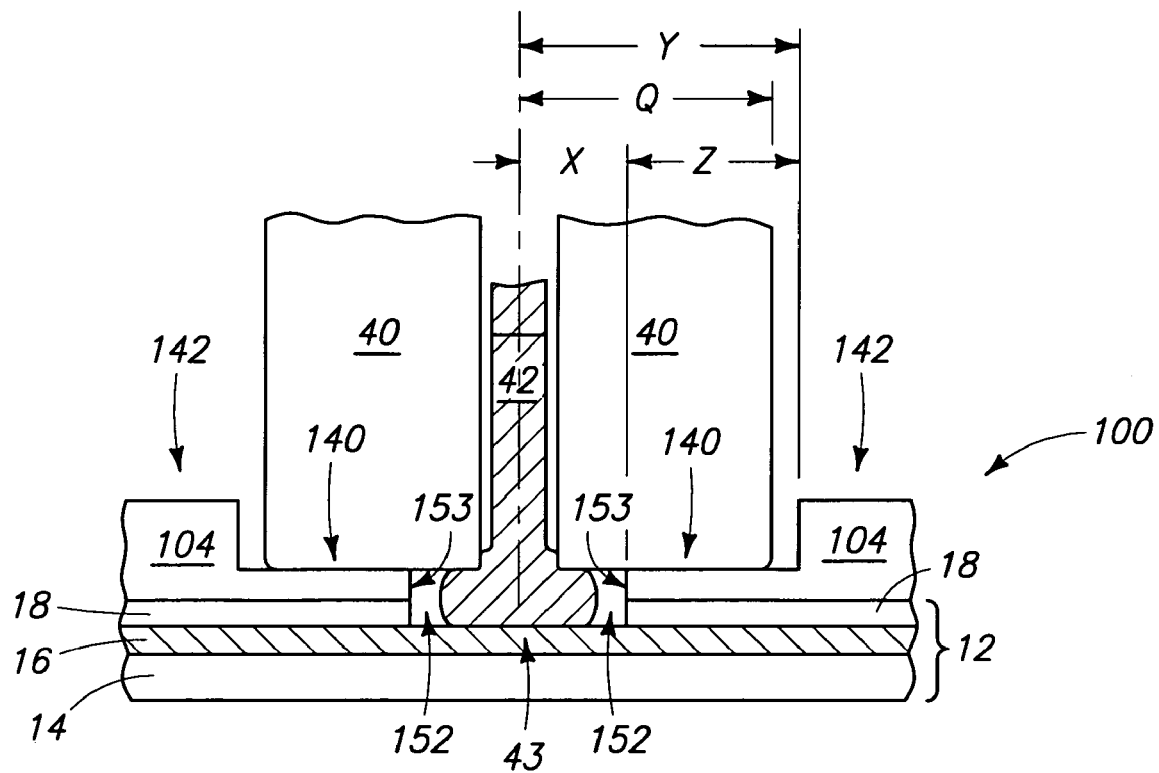
F I G 12

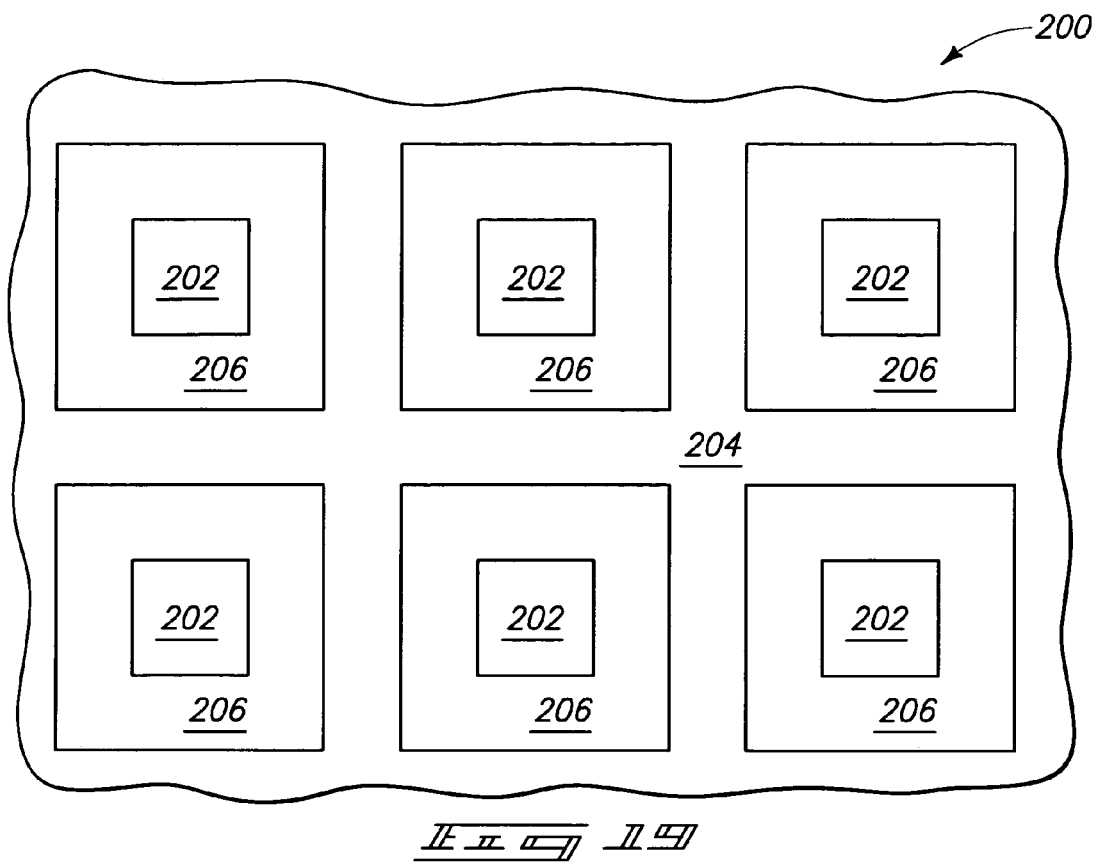
_Fig 19_
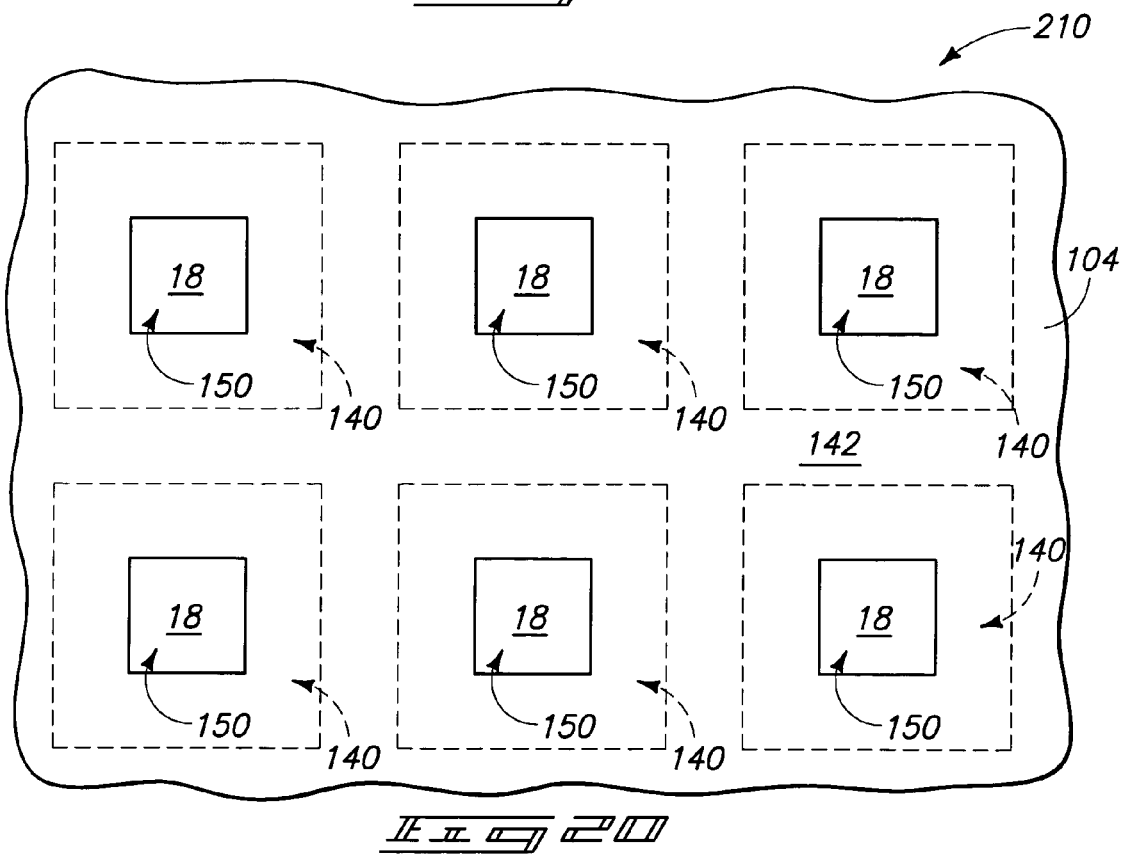
_Fig 20_

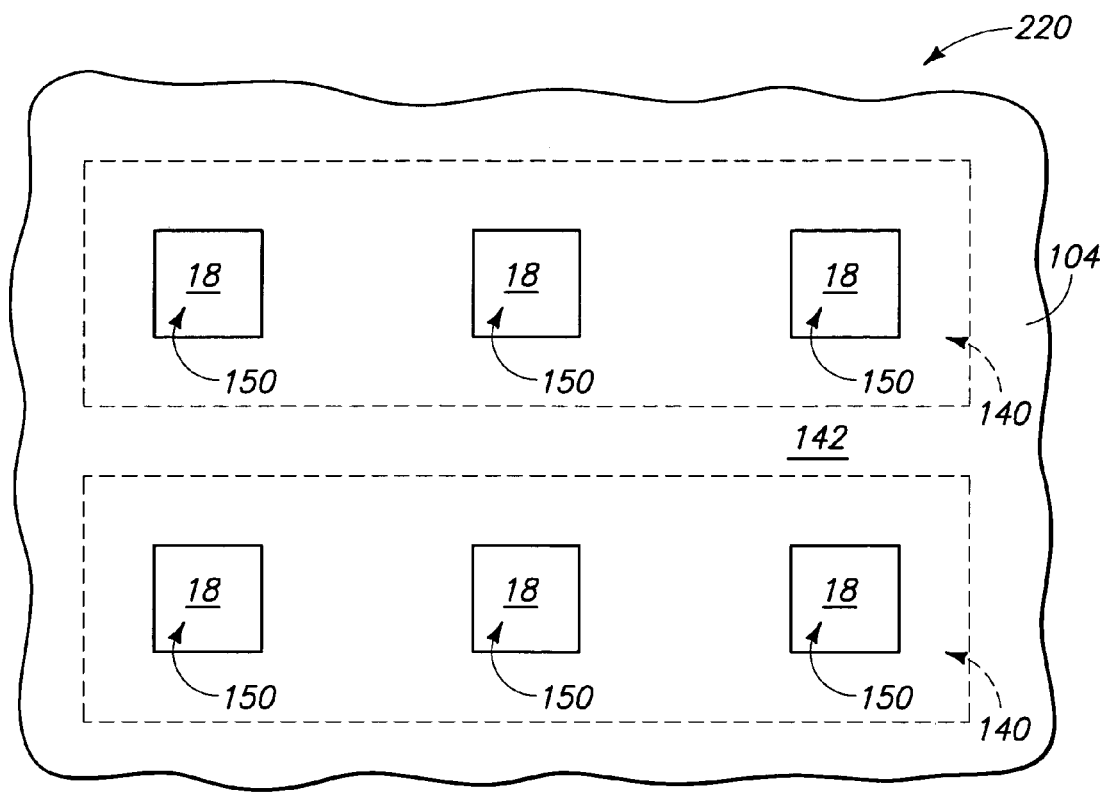
F I G 21
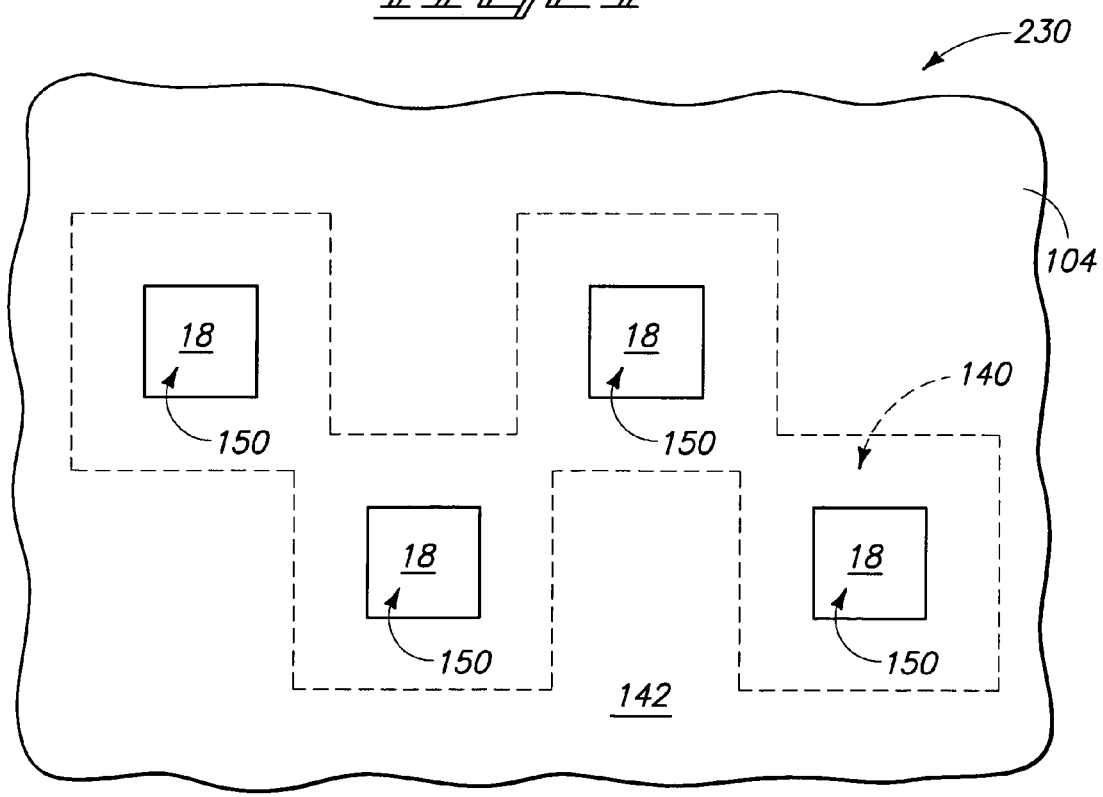
F I G 22

METHODS OF FORMING WIRE BONDS FOR SEMICONDUCTOR CONSTRUCTIONS

TECHNICAL FIELD

The invention pertains to semiconductor constructions comprising multi-level patterns of radiation-imageable material, and also pertains to methods of forming wire bonds for semiconductor constructions.

BACKGROUND OF THE INVENTION

Wire bonds are commonly utilized for connecting integrated circuitry associated with semiconductor constructions to other circuitry external of the constructions. An exemplary prior art method of forming a wire bond for a semiconductor construction is described with reference to FIGS. 1-7.

Referring initially to FIG. 1, a semiconductor construction 10 is illustrated at a preliminary processing stage of the prior art method. Construction 10 comprises a semiconductor substrate 12 which includes a base 14, a conductive material 16 supported by the base, and an electrically insulative cap 18 over the conductive material.

Base 14 can comprise a semiconductor material, such as, for example, a monocrystalline silicon wafer having numerous integrated circuit devices (not shown) supported thereby.

Conductive material 16 can correspond to, for example, a metal-containing level formed over and in electrical connection with various integrated circuit devices associated with base 14. Conductive material 16 can, for example, correspond to the so-called level 1, level 2, level 3, level 4, level 5, etc. metal layers commonly associated with semiconductor constructions. In particular aspects, conductive material 16 can comprise, consist essentially of, or consist of aluminum and/or copper. In such aspects, material 16 can, for example, comprise one or more alloys comprising one or both of copper and aluminum. Conductive material 16 has an upper surface 17.

Insulative material 18 is a protective material formed over the uppermost surface of conductive material 16, and can comprise any suitable insulative material or combination of insulative materials. In particular aspects, insulative material 18 will comprise, consist essentially of, or consist of one or both of silicon nitride and silicon dioxide, For instance, insulative material 18 can comprise a homogeneous layer of silicon dioxide or silicon nitride. Alternatively, material 18 can comprise a multi-layer stack, with particular layers being silicon dioxide and other layers being silicon nitride. Insulative material 18 has an uppermost surface 19 (the label "19" is shown in FIG. 4).

Substrate 12 can be referred to as a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In accordance with the definition of substrate provided above, all of the structures 14, 16 and 18 can be together considered to correspond to a semiconductor substrate. Alternatively, structure 14 can be considered to alone correspond to a semiconductor substrate. As yet another alternative, structure 14 and structure 16 can be considered to correspond to a semiconductor substrate, with structure 18 being considered to be formed over such semiconductor substrate.

A patterned radiation-imageable material 20 is formed over the uppermost surface 19 of insulative material 18. Radiation-imageable material 20 can correspond to photoresist, and can be photolithographically formed into the shown pattern. The photolithographic patterning of material 20 would typically comprise exposure of material 20 to a pattern of radiation, with such radiation being suitable to render exposed portions of material 20 either more or less soluble than non-exposed portions of the material in a solvent. The material 20 is then exposed to the solvent to remove the more soluble portions and thus form the shown pattern. The shown patterned material 20 has an opening 22 extending therethrough to an upper surface of insulative material 18.

Referring next to FIG. 2, the opening 22 is extended through insulative material 18 to an upper surface of conductive material 16 with an appropriate etch.

Referring next to FIG. 3, patterned material 20 (FIG. 2) is removed.

Referring next to FIG. 4, a patterned protective material 30 is formed over insulative material 18. In some aspects, insulative material 18 can be considered a passivation layer (or layers), and material 30 can be considered a protective cap formed over the passivation layer (or layers). Material 30 can correspond to a photolithographically patterned radiation-imageable material, and in some aspects comprise, consist essentially of, or consist of polyimide. The patterned material 30 defines an opening 32 extending to an upper surface of material 18. Opening 32 is wider than the opening 22 described previously (FIG. 3).

FIG. 5 is a top view of the FIG. 4 construction, and shows the wide opening 32 entirely surrounding narrow opening 22. Openings 22 and 32 are shown having rectangular peripheries, but it is to be understood that the openings can be formed in any suitable configuration, including, for example, configurations with curved peripheries.

Referring next to FIG. 6, a tool 40 is utilized to bond a wire 42 to conductive material 16. The wire 42 is retained within a capillary 44 of tool 40, and accordingly the tool can be referred to as a bonder capillary tool. The bonding of wire 42 to material 16 is accomplished by contacting the wire onto the upper surface 17 of material 16 with typically known in the art ultrasonic, thermal or other energy to weld the wire 42 and material 16 together. The region of material 16 where wire 42 connects with the material can be referred to as a wire bonding region of the material 16, and is indicated by the label 43 in FIG. 6. More specifically, a wire bonding region of material 16 is the portion of material 16 that ultimately directly contacts wire 42 in forming a bond to the wire. The wire can comprise, for example, gold.

Tool 40 has a shown lower portion proximate material 16, and such portion has a lateral width 50. Such lateral width which can be referred to as the lateral footprint of tool 40 proximate a bonding region. In the shown aspect of the prior art, such lateral footprint problematically extends over masking material 30 and accordingly the masking material is smashed downwardly by tool 40 during the bonding of wire 42 to material 16. The smashing of material 30 leads to smashing of the underlying material 18, which forms a damage regions 52 of material 18. The damage region can problematically contain cracks or other undesired structural flaws.

Referring to FIG. 7, tool 40 is removed to leave wire 42 bonded to the wire bonding region of material 16. Unfortunately, the damaged regions of materials 30 and 18 remain after removal of the tool. Accordingly, it is desired to develop new methods for forming wire bonds which alleviate formation of damaged regions within materials 30 and 18.

Although only one wire bond is shown formed in the diagrams of FIGS. 1-7, it should be understood that a large number of wire bonds is typically formed over a single substrate, with each wire bond being fabricated with the methodology of FIGS. 1-7.

A continuing goal of semiconductor processing is to reduce photomasking steps, in that each photomasking step carries with it a risk of mask misalignment and defect creation. Accordingly, it is desired to develop methodologies of forming wire bonds which reduce photomasking steps relative to the number of steps utilized in the processing sequence of FIGS. 1-7.

Although the invention was motivated, at least in part, by the problems discussed above, the invention is not limited to solutions of such problems.

SUMMARY OF THE INVENTION

In one aspect, the invention encompasses a method of forming a wire bond for a semiconductor construction. A semiconductor substrate is provided, and such substrate has a wire bonding region defined therein. A photolithographically patterned radiation-imageable material is formed to be at least partially around the lateral periphery of the wire bonding region. The patterned radiation-imageable material has a recessed region adjacent the wire bonding region and laterally inward of a second region. A wire bond is formed to the wire bonding region using a tool having a lateral footprint of a portion proximate the wire bonding region. The forming of the wire bond comprises bringing the portion of the tool within an elevational distance of an upper surface of the wire bonding region. The recessed region has a height less than the elevational distance of the portion of the tool, and the second region has a height greater than or equal to the elevational distance of the portion of the tool. The lateral footprint is less than the lateral distance from the wire bonding region to the second region of the radiation-imageable material.

In one aspect, a method of forming a wire bond for a semiconductor construction includes the following steps. A semiconductor substrate is provided. The substrate includes a metal-containing layer and an electrically insulative cap over the metal-containing layer. A polyimide-containing layer of substantially uniform thickness is formed over the electrically insulative cap. The polyimide-containing layer is exposed to a pattern of radiation. The radiation changes the solubility of the polyimide-containing layer in a developing solvent. The pattern comprises a moderate intensity region interposed between a high intensity region and a low intensity region. A first portion of the polyimide-containing layer is exposed to the high intensity region, a second portion of the polyimide-containing layer is exposed to the moderate intensity region, and a third portion of the polyimide-containing layer is exposed to the low intensity region. After the polyimide-containing layer is exposed to the pattern of radiation, the polyimide-containing layer is exposed to the solvent to form a multi-level pattern in the polyimide-containing layer. The first portion of the polyimide-containing layer is substantially entirely removed by the solvent, the third portion is substantially not removed by the solvent, and the second portion is partially removed by the solvent so that the second portion is reduced in thickness relative to the third portion. The multi-level patterned polyimide-containing layer is utilized as a mask while forming an opening through the cap and to the metal-containing layer. A wire bonding region of the metal-containing layer is exposed within the opening, and a wire bond is formed to the wire bonding region.

In one aspect, the invention encompasses a semiconductor construction which comprises a semiconductor substrate having a metal-containing layer. A wire bond is bonded to the metal-containing layer at a wire bonding region of the metal-containing layer. A multi-level pattern of radiation-imageable material is over the metal-containing layer. The multi-level pattern of radiation-imageable material has a first topographical region and a second topographical region which are each defined by substantially horizontal uppermost surfaces. The substantially-horizontal uppermost surface of the first topographical region is elevationally below the substantially-horizontal uppermost surface of the second topographical region by at least about 2 microns. The first topographical region is between the second topographical region and the wire bonding region of the metal-containing layer.

BRIEF DESCRIPTION OF THE DRAWINGS

Preferred embodiments of the invention are described below with reference to the following accompanying drawings.

FIG. 8 is a diagrammatic, fragmentary cross-sectional view of a semiconductor construction at a preliminary processing stage of an exemplary aspect of the present invention.

FIG. 9 is a view of the FIG. 8 construction shown at a processing stage subsequent to that of FIG. 8.

FIG. 10 is a view of the FIG. 8 construction shown at a processing stage subsequent to that of FIG. 9.

FIG. 11 is a fragmentary top view of the construction comprising the FIG. 10 cross-section, with the cross-section of FIG. 10 being shown along the line 10-10 of FIG. 11.

FIG. 12 is a view of the FIG. 8 construction shown at a processing stage subsequent to that of FIG. 10.

FIG. 19 is a fragmentary view of an exemplary reticle that can be utilized for patterning radiation in an exemplary aspect of the invention.

FIG. 20 is a top view of a semiconductor construction having a photolithographically patterned layer thereover, with such layer having been patterned utilizing the reticle of FIG. 19.

FIG. 21 is a top view of a semiconductor construction having a photolithographically patterned layer thereover, illustrating an alternative aspect of the invention relative to that of FIG. 20.

FIG. 22 is a top view of a semiconductor construction having a photolithographically patterned layer thereover, illustrating an alternative aspect of the invention relative to those of FIGS. 20 and 21.

DETAILED DESCRIPTION OF THE PREFERRED EMBODIMENTS

Figure 1:
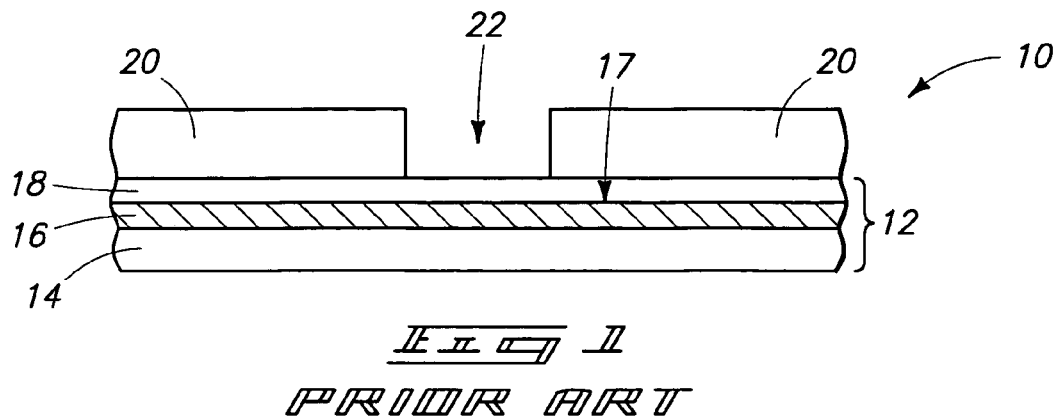
FIG. 1 is a diagrammatic, cross-sectional view of a semiconductor construction at a preliminary processing stage of a prior art method of forming a wire bond.
Figure 2:
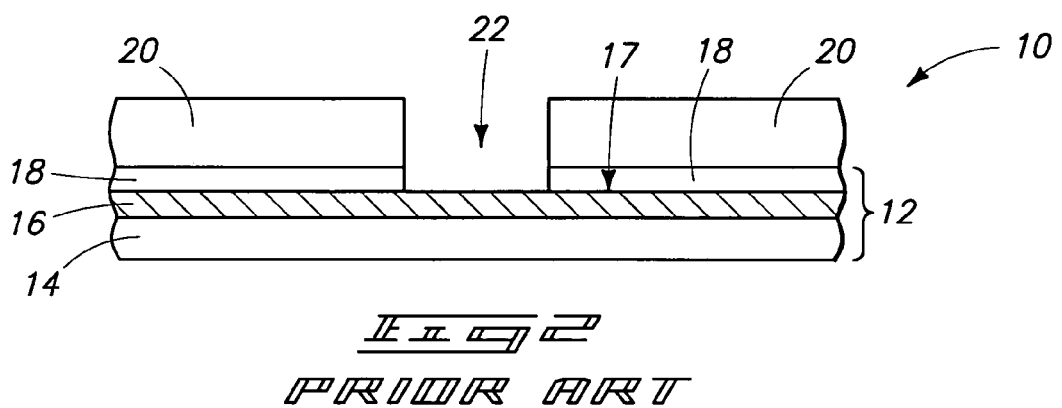
FIG. 2 is a view of the FIG. 1 construction shown at a prior art processing stage subsequent to that of FIG. 1.
Figure 3:
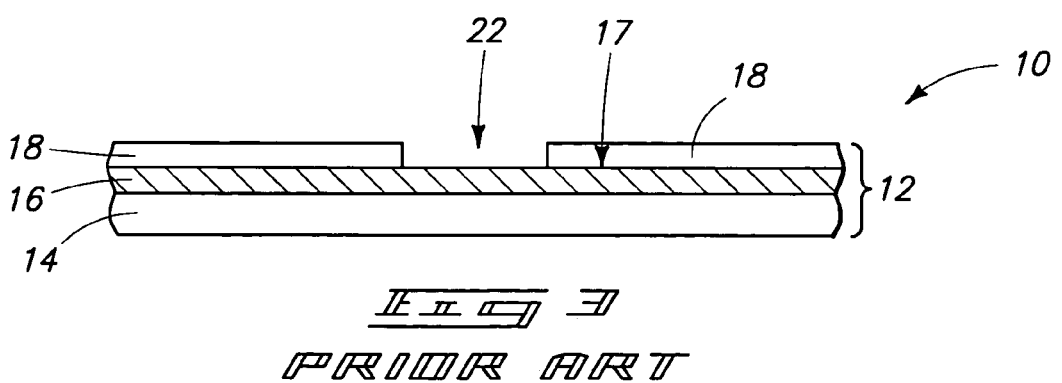
FIG. 3 is a view of the FIG. 1 construction shown at a prior art processing stage subsequent to that of FIG. 2.
Figure 4:
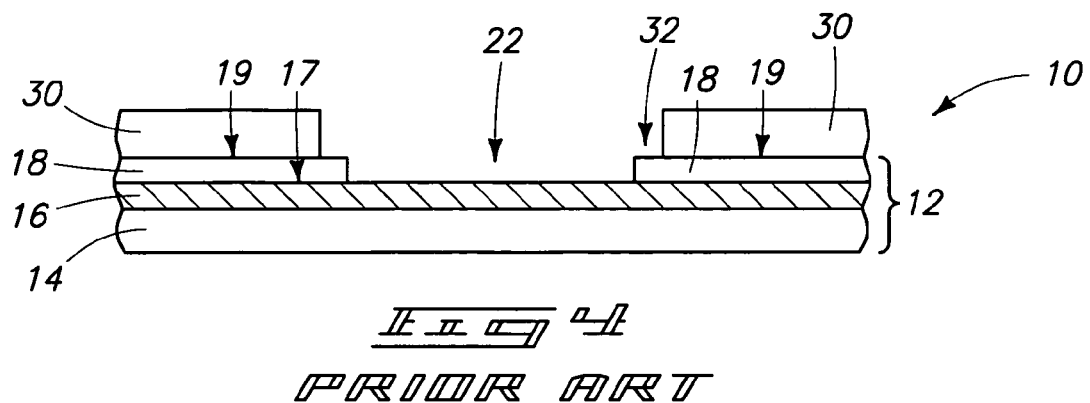
FIG. 4 is a view of the FIG. 1 construction shown at a prior art processing stage subsequent to that of FIG. 3.
Figure 5:
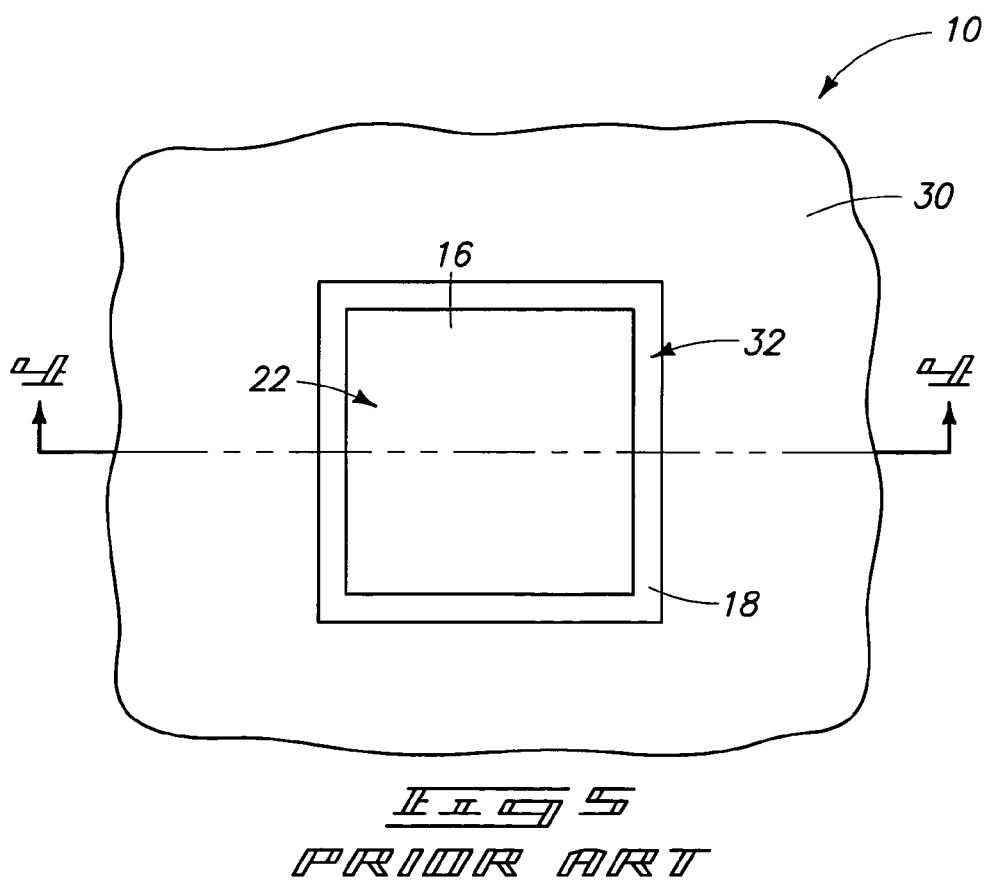
FIG. 5 is a top view of the fragment comprising the FIG. 4 construction, with the cross-section of FIG. 4 as shown along the line 4-4 of FIG. 5.

This disclosure of the invention is submitted in furtherance of the constitutional purposes of the U.S. Patent Laws "to promote the progress of science and useful arts" (Article 1, Section 8).

One aspect of the invention is to form a multi-level (i.e., stepped profile) radiation-imageable material (such as, for example, polyimide) around wire bonding regions of conductive material prior to wire-bonding. The stepped profile of the radiation-imageable material allows adequate clearance for a wire bonding tool so that the prior art problem of crushing of a polyimide material during wire bonding is avoided. In addition, formation of a stepped profile avoids the mask misalignment and defect risks associated with multiple masking steps in the prior art. The multi-level pattern of the radiation-imageable material can be formed utilizing a reticle which is designed to have a partially transmissive layer and/or a sub-resolution chromium pattern bordering relatively fully transmissive portions of the reticle. The reticle can achieve partial exposure of a region at the edge of a location where an opening is to be formed around a bonding region. Specific exemplary aspects of the invention are described with reference to FIGS. 8-20.

Referring initially to FIG. 8, a construction 100 is illustrated at a preliminary process stage of an exemplary aspect of the present invention. In referring to construction 100, similar numbering will be utilized as was used above in describing FIGS. 1-7, where appropriate.

Construction 100 comprises the substrate 12 described previously, with such substrate comprising base 14, conductive material 16, and insulative material cap 18. As discussed above, base 14 can comprise a semiconductor material, and accordingly substrate 12 can be a semiconductor substrate.

Figure 6:
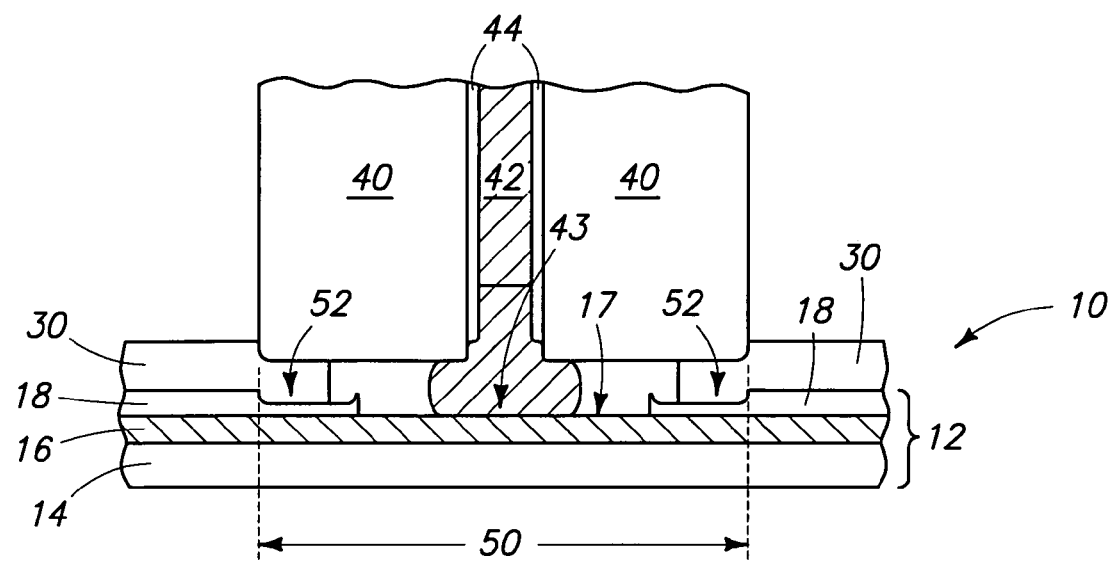
FIG. 6 is a view of the FIG. 1 construction shown at a prior art processing stage subsequent to that of FIG. 4.
Figure 7:
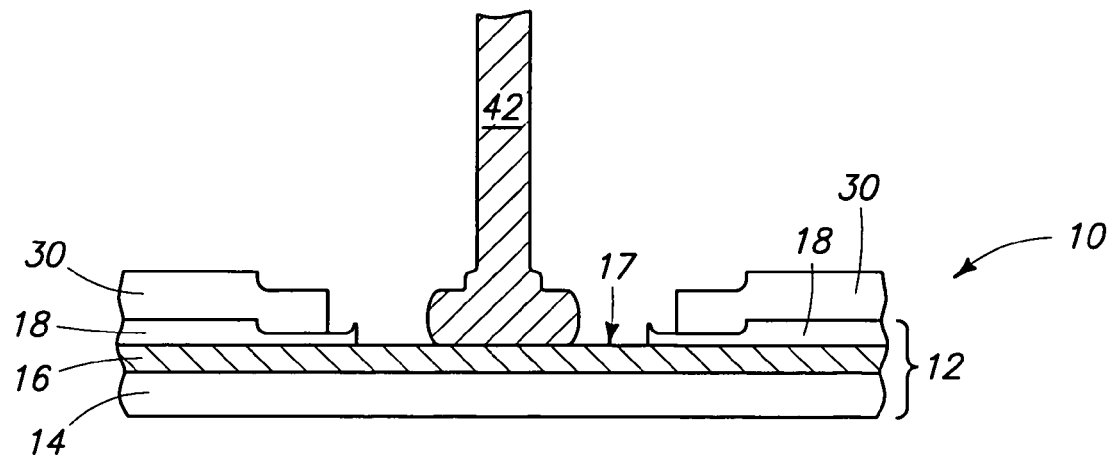
FIG. 7 is a view of the FIG. 1 construction shown at a prior art processing stage subsequent to that of FIG. 6.

Ultimately, a wire bond similar to the bond of FIGS. 6 and 7 will be formed over conductive material 16, and accordingly conductive material 16 can be considered to have a wire bonding region defined therein (with such wire bonding region being illustrated diagrammatically by arrow 102 in FIG. 8).

A radiation-imageable material 104 is formed over insulative material cap 18. The radiation-imageable material is shown formed as a layer of substantially uniform thickness over substrate 12, and accordingly over the structures 14, 16 and 18 of substrate 12. Radiation-imageable material 104 can comprise any suitable-material, and in typical aspects will be electrically insulative. Radiation-imageable material 104 can, for example, comprise, consist essentially of, or consist of polyimide. Material 104 will typically be at least about 2 microns thick, and frequently at least about 5 microns thick, with typical suitable thicknesses for material 104 being from about 2 microns to about 20 microns. In a particular aspect of the invention, material 104 is formed to be about 10 microns thick.

Radiation-imageable material 104 is exposed to a pattern of radiation 106. Such pattern comprises high intensity regions 108, low intensity regions 112, and moderate intensity regions 110 between the high intensity regions and the low intensity regions. The relative intensities of the various regions of patterned radiation is diagrammatically illustrated by the magnitude of arrows (representing radiation) within the regions. The radiation can correspond to, for example, 365 nanometer I-line radiation.

The patterned radiation is formed by passing radiation through a reticle (not shown in FIG. 8). Such reticle can have relatively transparent portions where the high intensity radiation passes through, relatively opaque regions where the low intensity radiation passes, and moderately transparent regions where the moderate intensity radiation passes. In particular aspects, the regions where the low intensity radiation of the pattern is formed can be opaque regions of the reticle so that the low intensity regions correspond to zero intensity regions. An exemplary reticle configured in accordance with an aspect of the invention is discussed below with reference to FIG. 19.

The substrate 12 comprises a first portion 120 exposed to the high intensity regions, a second portion 122 exposed to the moderate intensity regions, and a third portion 124 exposed to the low intensity regions of the radiation. Accordingly, material 104 comprises a first portion exposed to the high intensity regions of radiation, a second portion exposed to the moderate intensity regions of radiation, and a third portion exposed to the low intensity regions of radiation.

The exposure of the radiation-imageable material 104 to the radiation alters the solubility of the material in a solvent. Specifically, regions of material 104 exposed to high intensity regions of radiation are rendered more soluble in the solvent than the regions exposed to moderate intensity radiation or low intensity radiation, and the regions exposed to moderate intensity radiation are rendered more soluble in the solvent than the regions exposed to low intensity radiation. In exemplary aspects in which radiation-imageable material 104 corresponds to polyimide, a suitable solvent can comprise an aqueous-solution of tetramethylammonium hydroxide (such as, for example, a solution containing about 2.4% of tetramethylammonium hydroxide in water).

Referring to FIG. 9, construction 100 is illustrated after material 104 is exposed to the suitable solvent. Such removes the portion of material 104 exposed to the high intensity radiation (portion 120) to a greater extent than the other portions of material 104, and removes the portion exposed to the moderate intensity radiation (portion 122) to a greater extent than the portion exposed to the low intensity radiation (portion 124). The extent to which portion 120 of material 104 is removed can be referred to as a first extent, the extent to which portion 122 of material 104 is removed can be referred to as a second extent, and the amount to which portion 124 of material 104 is removed can be referred to as a third extent. In particular aspects, substantially an entirety of the portion 120 of material 104 is removed by the solvent, and substantially none of the portion 124 of material 104 is removed by the solvent. The removal of a substantial entirety of portion 120 includes aspects in which an entirety of portion 120 is removed, as well as aspects in which nearly an entirety of portion 120 is removed; and the removal of substantially zero of portion 124 includes aspects in which none of portion 124 is removed, as well as aspects in which nearly none of portion 124 is removed.

The removal of differing amounts of material 104 from portions 120, 122 and 124 forms a multi-level pattern in the radiation-imageable material 104. Such multi-level pattern includes a first topographical region 140 defined by a substantially horizontal uppermost surface 141 at a first elevational level, and a second topographical region 142 defined by a substantially horizontal uppermost surface 143 at a second elevational level. The lower topographical region 140 can be considered a recessed region relative to the higher topographical region 142.

The elevational level of surface 143 is above the elevational level of surface 141, and in the shown aspect of the invention surfaces 141 and 143 are joined to one another through a single step 144. Such single step predominantly comprises a surface 145 which is substantially orthogonal to the surfaces 141 and 143. Although surfaces 141 and 143 are joined to one another through only one step in the embodiment of FIG. 9, it is to be understood that the invention encompasses other aspects in which the surfaces are joined through multiple steps, as discussed below with reference to FIG. 17. Also, although the step is shown having a predominant surface substantially orthogonal to surfaces 141 and 143, it is to be understood that the invention encompasses other aspects in which the step comprises a sloped surface which is not substantially orthogonal to the uppermost surfaces 141 and 143, as discussed below with reference to FIG. 16.

A difference in elevational height of uppermost surface 143 relative to surface 141 can be, for example, at least about 2 microns, at least about 4 microns, at least about 5 microns, at least about 10 microns, or even at least about 20 microns. In typical aspects, the difference in height between surfaces 141 and 143 will be from about 2 microns to about 20 microns. In some aspects, the elevational level of surface 143 is five-times as high as the elevational level of surface 141 as measured relative to the uppermost surface 19 of material 18.

The removal of first portion 120 of radiation-imageable material 104 forms an opening 150 extending through the radiation-imageable material to the uppermost surface 19 of insulative-material cap 18. Opening 150 ultimately defines a location for formation of a wire bond, and accordingly patterned material 104 can be considered to correspond to a mask which defines a wire bonding region.

Referring next to FIG. 10, patterned radiation-imageable material 104 is utilized as a mask during an etch which extends the opening 150 through material 18 to the metal-containing layer 16. The etch can be any suitable etch for extending through material 18. In some aspects, the etch can remove some of material 104 during extension of opening 150 through material 18. In the shown aspect, the portion 122 of material 104 remains after the extension of opening 150 through material 18, but it is to be understood the invention encompasses other aspects in which such portion is removed during the etch through material 18 (such aspects are discussed in more detail below with reference to FIGS. 17 and 18).

FIG. 11 is a top view of a fragment of the construction 100 comprising the cross-section of FIG. 10. Such top view shows that opening 150 can be rectangular in particular aspects of the invention, but it is to be understood that the opening can have other shapes In other aspects (not shown). FIG. 11 also shows that recessed region 140 can extend entirely around opening 150 in some aspects of the invention. It is to be understood, however, that the invention encompasses other aspects in which the recessed region extends only partially around opening 150. Opening 150 can be considered to comprise a lateral periphery 151 which is the perimeter around opening 150, and recessed region 140 can be considered to extend laterally around the entirety of such lateral periphery in the aspect shown in FIG. 11. Further, recessed region 140 can be considered to be laterally inward of non-recessed region 142 relative to the periphery 151 of opening 150. Accordingly, non-recessed region 142 is spaced from opening 150 by at least a lateral width of recessed region 140. The recessed region is shown having the same lateral width around an entirety of opening 150, but it is to be understood that the invention includes other aspects (not shown) in which the lateral width of the recessed region varies around the opening. For instance, the lateral width of the recessed region can be thinner on one side of opening 150 than along an opposing side of the opening.

Referring next to FIG. 12, the tool 40 described previously with reference to FIG. 6 is utilized to bond the wire 42, which was also described previously, to a wire bonding region 43 of material 16. The tool has a lateral width "Q" from a center of the wire bonding region to an exterior lateral edge of the tool.

Material 104 has an inner lateral periphery 153 (with such inner lateral periphery being the periphery of material 140 which is nearest bonding region 43), and such inner lateral periphery is spaced from bonding region 43 by gaps 152.

In the cross-section of FIG. 12, the inner lateral periphery 153 is spaced from the center of the wire bonding region by a distance "X", and topographical region 142 of material 104 is spaced from the inner lateral periphery 153 by a lateral distance "Z". Lateral distance "Z" can be referred to as a lateral width of first topographical region 140, and can be at least about 10 microns, at least about 20 microns, or even at least about 30 microns. One aspect of the invention is the recognition that it can be preferred that the combined distance of lateral width "Z" and lateral width "X" (i.e., the distance "Y" of FIG. 12) be greater than the lateral footprint of a wire bond tool. Tool 40 can then be received within the recessed portion 140 of patterned material 104, and accordingly does not crush the material, in contrast to the prior art problems discussed above with reference to FIG. 6. The relative sizes of distances "X" and "Z" of FIG. 12 can be tailored to match specific tools utilized for forming wire bonds.

Figure 13:
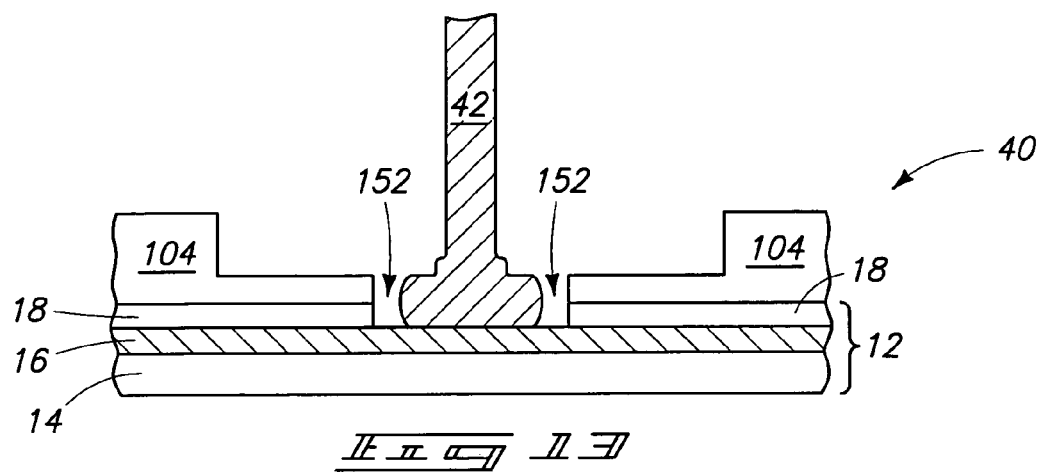
FIG. 13 is a view of the FIG. 8 construction shown at processing stage subsequent to that of FIG. 12.

FIG. 13 shows construction 100 after removal of tool 40, and shows wire 42 bonded to conductive material 16.

FIGS. 8-13 illustrate exemplary aspects of the invention, but it is to be understood that various of the described aspects can be modified. For instance, FIG. 14 shows construction 100 at a processing stage identical to that of FIG. 10, but in accordance with an aspect of the invention in which all of the second portion 140 of material 104 (FIG. 9) is removed during the etch to form opening 150.

Figure 14:
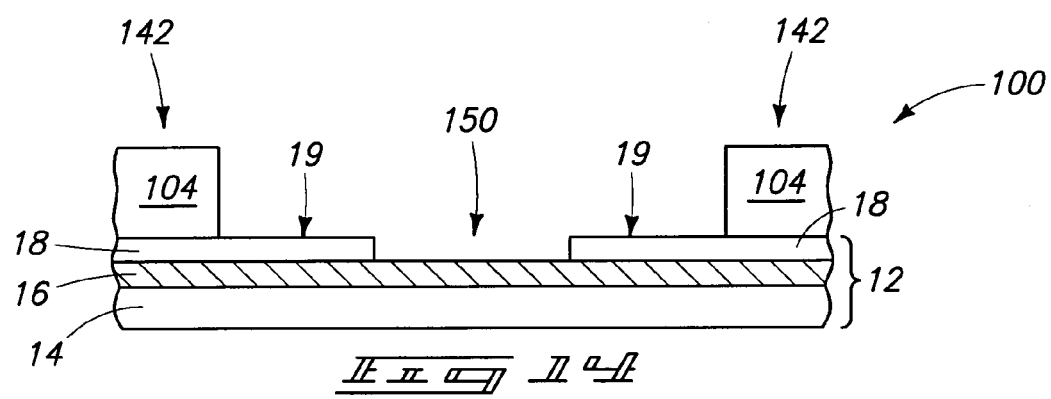
FIG. 14 is a view of the FIG. 8 construction shown at a processing stage subsequent to that of FIG. 9 in accordance with an aspect of the invention alternative to that of FIG. 10.
Figure 15:
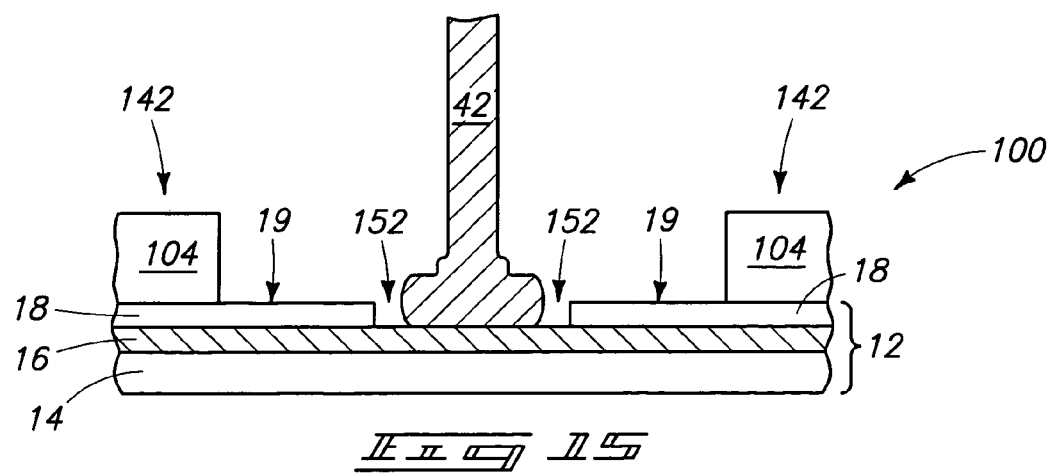
FIG. 15 is a view of the FIG. 14 construction shown at a processing stage subsequent to that of FIG. 14.
Figure 16:
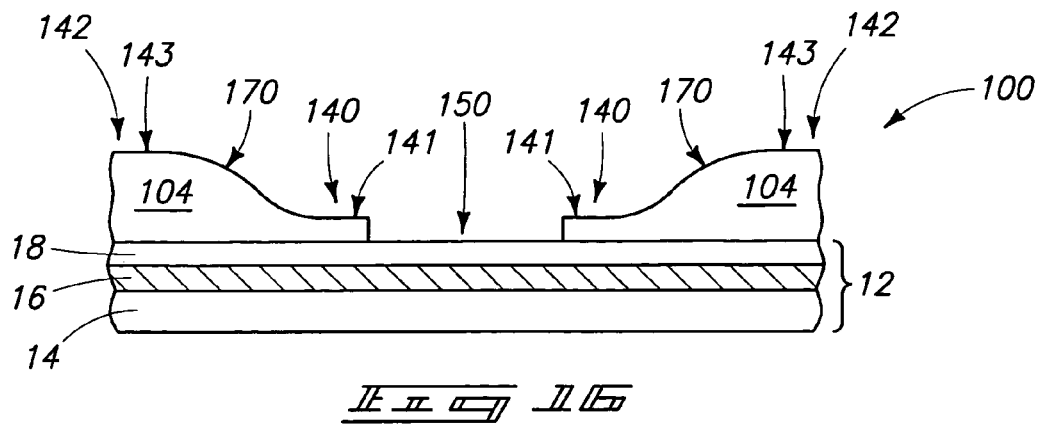
FIG. 16 is a view of the FIG. 8 construction shown at a processing stage subsequent to that of FIG. 8 in accordance with an aspect of the invention alternative to that of FIG. 9.

FIG. 15 shows the construction of FIG. 14 after it has been subjected to processing identical to that of FIGS. 12 and 13 to form a wire bond within opening 150. In contrast to the embodiment in FIGS. 12 and 13, the wire bond formed within opening 150 of FIG. 16 is spaced from the raised portion 142 of material 104 by a gap which does not include a recessed portion of material 104. Rather, such gap includes the exposed upper surface 19 of material 18. In the shown aspect of the invention, the wire bonding region only partially fills opening 150. Accordingly, the raised portion 142 of material 104 is separated from the wire bonding region by a lateral expanse comprising the gap 152 in addition to the upper surface 19 of material 18.

FIG. 16 shows construction 100 at the processing stage of FIG. 9 in accordance with an aspect of the invention in which a sloped step 170 joins lower surface 141 of the first topographical region 140 to upper surface 143 of the second topographical region 142 of material 104. Step 170 is not substantially orthogonal to the substantially horizontal surfaces 142 and 141, but instead comprises a relatively gradual incline between the surfaces 141 and 143.

Figure 17:
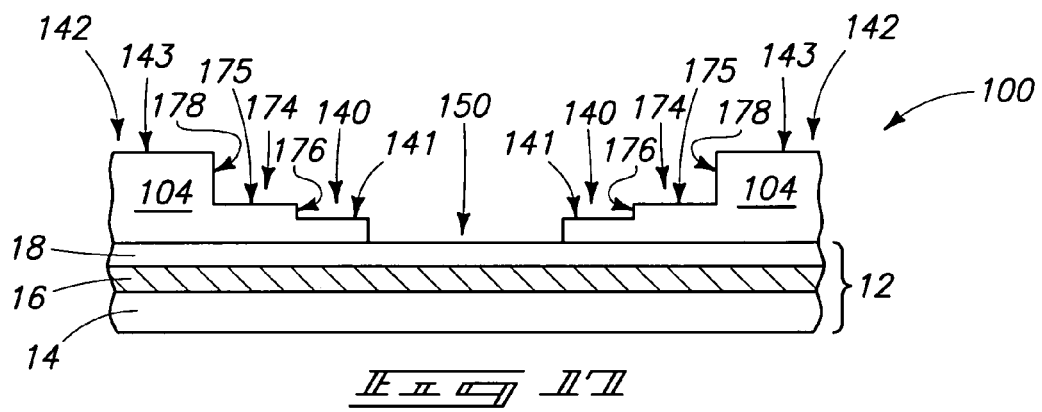
FIG. 17 is a view of the FIG. 8 construction shown at a processing stage subsequent to that of FIG. 8 in accordance with an aspect of the invention alternative to that of FIG. 9.
Figure 18:
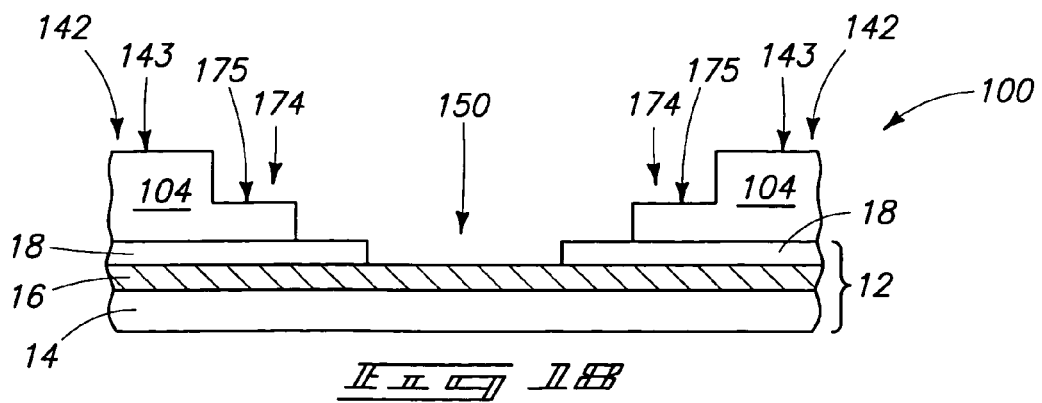
FIG. 18 is a view of the FIG. 17 construction shown at a processing stage subsequent to that of FIG. 17.

FIGS. 17 and 18 illustrate an aspect of the invention in which multiple steps connect the surface 141 of the first topographical region with the surface 143 of the uppermost topographical region of material 104.

Referring first to FIG. 17, such shows construction 100 at the processing stage of FIG. 9 in accordance with an aspect of the invention in which multi-level material 104 is patterned to comprise three topographical regions. Material 104 comprises a topographical region 174 between the previously discussed regions 140 and 142. Topographical region 174 is at an immediate height relative to regions 140 and 142, and is shown comprising an uppermost substantially horizontal surface 175 which is elevationally between the surfaces 141 and 143.

Multi-level material 104 is shown comprising a first step 176 between regions 140 and 174, and a second step 178 between regions 174 and 142. Thus, there are two steps between regions 140 and 142 in the configuration of FIG. 17. It is to be understood that the invention encompasses other aspects of the invention (not shown) wherein more than two steps are between the lowest-most region of multi-level material 104 and the highest most elevational level of the multi-level material.

The construction of FIG. 17 can be formed with processing similar to that of FIG. 8, but by utilizing a reticle having additional levels of intensity beyond those shown in FIG. 8. Although the steps of the FIG. 17 invention are shown as being substantially orthogonal to the horizontal uppermost surfaces 141, 175 and 143, it is to be understood that one or more of the steps can be sloped in a configuration similar to that of FIG. 16, rather than being in the shown substantially orthogonal configuration.

FIG. 18 shows the construction of FIG. 17 at a processing stage subsequent to extension of opening 150 through cap 18. In the shown aspect of the invention, the etch utilized to extend the opening through cap 18 has removed the lowest-most portion 140 (FIG. 17) from material 104 to expose an upper surface of cap 18 at the processing stage of FIG. 18. The structure of FIG. 18 can be subsequently processed with processing similar to that of FIGS. 12 and 13 to form a wire bond within opening 150.

FIG. 19 illustrates an exemplary reticle 200 which can be utilized at the processing stage of FIG. 8 to define a plurality of bonding regions and a multi-level pattern in a radiation-imageable material. Reticle 200 comprises a plurality of substantially transparent regions 202 over a relatively opaque substrate 204, and comprises a plurality of regions 206 having more transparency than substrate 204, but less transparency than regions 202. In typical aspects of the invention, substrate 204 can correspond to quartz covered with chrome, transparent regions 202 can correspond to areas where the chrome is not over the quartz, and moderate transparency regions 206 can correspond to regions where any suitable partially transmissive material or combination of materials is formed over the quartz.

FIG. 20 shows a semiconductor construction 210 having the composition described previously with reference to FIG. 8, and shown at the processing stage of FIG. 9 after the construction has been exposed to patterned radiation passed through the reticle of FIG. 19. Accordingly, construction 210 comprises a multi-level patterned radiation-imageable material 104 having openings 150 extending therethrough where high intensity radiation has passed through transmissive regions 202. Openings 150 extend to an insulative cap 18 of the type described previously with reference to FIGS. 8 and 9.

The multi-level patterned material 104 comprises an uppermost topographical region 142 where the relatively low intensity radiation has been patterned by relatively opaque region 204 of the reticle 200 of FIG. 19, and comprises recessed topographical features 140 where the moderate intensity radiation has been patterned by moderately transmissive regions 206 of the reticle 200. Boundaries between recessed region 140 and non-recessed topographical region 142 of material 104 are demarcated by dashed lines in FIG. 20.

The multi-level pattern shown in FIG. 20 is but one exemplary multi-level pattern that can be formed in accordance with an aspect of the present invention. FIGS. 21 and 22 show constructions 220 and 230, respectively, which illustrate other exemplary multi-level patterns that can be formed in the material 104. In contrast to the pattern of FIG. 20 which had individual recessed regions 140 surrounding single openings 150, the patterns of FIGS. 21 and 22 having multiple openings 150 surrounded by a common recessed region 140. FIG. 21 shows the openings 150 in a single row, and FIG. 22 shows the openings in a staggered configuration.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a wire bond for a semiconductor construction, comprising:
   providing a semiconductor substrate having a wire bonding region;
   providing a stepped electrically-insulative-radiation-imageable material at least partially around the wire bonding region, the stepped electrically-insulative-radiation-imageable material having a first region proximate the wire bonding region and a second region laterally further from the wire bonding region than first region; the second region being laterally spaced from the wire bonding region by a distance which includes at least a lateral width of the first region; the first region having a first elevational height, and the second region having a second elevational height which is above the first elevational height; the second region being joined to the first region through multiple steps; and forming a wire bond to the wire bonding region with a capillary having a lateral width less than the distance from the wire bonding region to the second region of the electrically-insulative-radiation-imageable material, the capillary being brought to a closest distance to the substrate during the wire bonding with said closest distance being above the first elevational height and below the second elevational height.

2. The method of claim 1 wherein the second elevational height is from about 2 microns to about 20 microns above the first elevational height.

3. The method of claim 1 wherein the second elevational height is at least about 4 microns above the first elevational height.

4. The method of claim 1 wherein the electrically-insulative-radiation-imageable material comprises polyimide.

5. The method of claim 1 wherein the electrically-insulative-radiation-imageable material consists essentially of polyimide.

6. The method of claim 1 wherein the electrically-insulative-radiation-imageable material consists of polyimide.

7. The method of claim 1 wherein the first region of the electrically-insulative-radiation-imageable material extends entirely around the wire bonding region.

8. The method of claim 1 wherein the first region of the electrically-insulative-radiation-imageable material does not extend entirely around the wire bonding region.

9. A method of forming a wire bond for a semiconductor construction, comprising:

providing a semiconductor substrate, the semiconductor substrate comprising a metal-containing layer;

forming a radiation-imageable material of substantially uniform thickness over the metal-containing layer;

exposing the radiation-imageable material to a pattern of radiation, the radiation changing the solubility of the radiation-imageable material in a developing solvent, the pattern comprising moderate intensity regions interposed between high intensity regions and low intensity regions; a first portion of the radiation-imageable material being exposed to the high intensity regions, a second portion of the radiation-imageable material being exposed to the moderate intensity regions, and a third portion of the radiation-imageable material being exposed to the low intensity regions;

after exposing the radiation-imageable material to the pattern of radiation, exposing the radiation-imageable material to the solvent to form a multi-level pattern in the radiation-imageable material, the first, second and third portions of the radiation-imageable material being removed to a first extent, second extent and third extent, respectively, by the solvent, the second extent being less than the first extent and greater than the third extent;

utilizing the patterned radiation-imageable material as a mask to define a wiring bond region of the metal-containing layer; and forming a wire bond to the wiring bond region, the forming of the wire bond comprising pressing a wire against the wiring bond region with a tool, the tool having a footprint where it is proximate the wiring bond region, the third portion of the radiation-imaging material being offset beyond said footprint of the tool by the combined first and second portions of the patterned radiation-imaging material.

10. The method of claim 9 wherein the first extent to which the first portion of the radiation-imageable material is removed by the solvent is removal of substantially an entirety of the first portion.

11. The method of claim 9 wherein the third extent to which the third portion of the radiation-imageable material is removed by the solvent is substantially zero removal of the third portion.

12. The method of claim 9 wherein the radiation-imageable material comprises polyimide.

13. The method of claim 9 wherein the radiation-imageable material consists essentially of polyimide.

14. The method of claim 9 wherein the radiation-imageable material consists of polyimide.

15. The method of claim 9 wherein:

the substrate comprises an electrically-insulative cap over the metal-containing layer;

the first extent to which the first portion of the radiation-imageable material is removed by the solvent is removal of substantially an entirety of the first portion to form a patterned opening through the remaining radiation-imageable material; and the utilizing the patterned radiation-imageable material as a mask comprises conducting an etch which extends the patterned opening through the electrically-insulative cap to the metal-containing layer.

16. The method of claim 15 wherein the removal of the second portion of the radiation-imageable material to the second extent leaves a recessed remainder of the second portion over the substrate at the initiation of the etch, and wherein the etch does not remove a substantial entirety of such recessed remainder.

17. The method of claim 15 wherein the removal of the second portion of the radiation-imageable material to the second extent leaves a recessed remainder of the second portion over the substrate at the initiation of the etch, and wherein a substantial entirety of such recessed remainder is removed by the etch.

18. A method of forming a wire bond for a semiconductor construction, comprising:

providing a semiconductor substrate, the semiconductor substrate comprising a metal-containing layer and an electrically insulative cap over the metal-containing layer;

forming a polyimide-containing layer of substantially uniform thickness over the electrically insulative cap;

exposing the polyimide-containing layer to a pattern of radiation, the radiation changing the solubility of the polyimide-containing layer in a developing solvent, the pattern comprising moderate intensity regions interposed between high intensity regions and low intensity regions; a first portion of the polyimide-containing layer being exposed to the high intensity regions, a second portion of the polyimide-containing layer being exposed to the moderate intensity regions, and a third portion of the polyimide-containing layer being exposed to the low intensity regions;

after exposing the polyimide-containing layer to the pattern of radiation, exposing the polyimide-containing layer to the solvent to form a multi-level pattern in the polyimide-containing layer, the first portion of the polyimide-containing layer being substantially entirely removed by the solvent, the third portion of the polyimide-containing layer being substantially not removed by the solvent, and the second portion of the polyimide-containing layer being partially removed by the solvent so that the second portion is reduced in thickness relative to the third portion;

utilizing the multi-level patterned polyimide-containing layer as a mask while forming an opening through the cap and to the metal-containing layer; and forming a wire bond within the opening.

19. The method of claim 18 wherein the thickness of the third portion of multi-level patterned polyimide-containing layer is at least about 2 microns greater than the thickness of the second portion of the multi-level patterned polyimide-containing layer.

20. The method of claim 18 wherein the thickness of the third portion of multi-level patterned polyimide-containing layer is at least about 4 microns greater than the thickness of the second portion of the multi-level patterned polyimide-containing layer.

21. The method of claim 18 wherein the cap comprises one or both of silicon nitride and silicon dioxide.

22. The method of claim 18 wherein the polyimide-containing layer consists essentially of polyimide.

23. The method of claim 18 wherein the polyimide-containing layer consists of polyimide.

24. The method of claim 18 wherein:

the second portion of the multi-level patterned polyimide-containing layer extends at least partially around the opening; and the wire bond is formed with a capillary having a lateral width less than a distance from the wire bond to the third region of the multi-level patterned polyimide-containing layer.

25. The method of claim 24 wherein the second portion of the multi-level patterned polyimide-containing layer extends entirely around the opening.

26. The method of claim 24 wherein the second portion of the multi-level patterned polyimide-containing layer extends entirely around the opening and has a different lateral thickness along one portion of the opening than along another portion of the opening.

27. The method of claim 24 wherein the second portion of the multi-level patterned polyimide-containing layer extends only partially around the opening.

28. The method of claim 18 wherein:

the second portion of the multi-level patterned polyimide-containing layer extends entirely around the opening; and the wire bond is formed with a tool having a lateral footprint proximate the wire bond less than a distance to the third region of the multi-level patterned polyimide-containing layer.

* * * * *